(12) United States Patent
Goeke

(10) Patent No.: US 9,453,880 B2
(45) Date of Patent: Sep. 27, 2016

(54) ACTIVE SHUNT SOURCE-MEASURE UNIT (SMU) CIRCUIT

(71) Applicant: Keithley Instruments, Inc., Cleveland, OH (US)

(72) Inventor: Wayne C. Goeke, Hudson, OH (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 350 days.

(21) Appl. No.: 14/163,725

(22) Filed: Jan. 24, 2014

(65) Prior Publication Data

US 2015/0212110 A1    Jul. 30, 2015

(51) Int. Cl.
| | |
|---|---|
| G01R 15/00 | (2006.01) |
| G01R 27/08 | (2006.01) |
| G01R 31/317 | (2006.01) |
| G01R 1/20 | (2006.01) |

(52) U.S. Cl.
CPC ......... G01R 31/31721 (2013.01); G01R 1/203 (2013.01)

(58) Field of Classification Search
CPC ....... G01R 15/00; G01R 15/09; H03M 1/12; H03M 1/66

USPC .......... 324/115, 126, 609, 691, 713
See application file for complete search history.

(56) References Cited

U.S. PATENT DOCUMENTS

| | | | |
|---|---|---|---|
| 7,202,676 B2 | 4/2007 | Banaska et al. | |
| 7,276,893 B2 | 10/2007 | Banaska et al. | |
| 7,923,985 B2* | 4/2011 | Goeke | G01R 15/09 324/115 |
| 2006/0192547 A1 | 8/2006 | Banaska et al. | |
| 2009/0121908 A1* | 5/2009 | Regier | G01R 31/2841 341/142 |
| 2009/0273338 A1* | 11/2009 | Goeke | G01R 15/09 324/115 |

OTHER PUBLICATIONS

Extended European Search Report for European Patent Application No. 15151986.5, dated Jun. 24, 2015, 6 pages, Munich.

\* cited by examiner

*Primary Examiner* — Tung X Nguyen
*Assistant Examiner* — Neel Shah
(74) *Attorney, Agent, or Firm* — Marger Johnson

(57) ABSTRACT

An active shunt source-measure unit (SMU) circuit can include an SMU or power supply having an active shunt circuit that is integrated with the current measuring sub-circuit of the SMU circuit. The active shunt circuit may be active during voltage sourcing of the SMU circuit and deactivated during current sourcing of the SMU circuit.

7 Claims, 5 Drawing Sheets

ACTIVE SHUNT SOURCE-MEASURE UNIT (SMU) CIRCUIT

TECHNICAL FIELD

The disclosed technology pertains generally to source-measure unit (SMU) circuits and, more particularly, to the incorporating of certain aspects of active shunt circuit technology into an SMU circuit.

BACKGROUND

A typical active shunt circuit generally uses gain and capacitance to produce a virtual-impedance that is the actual resistance reduced by the gain. FIG. 1 is a circuit diagram illustrating an example of a conventional active shunt circuit 100. In the example, the active shunt circuit 100 uses gain $G_1(s)$ and capacitance $C_0$ to produce a virtual impedance $Z_{IN}$ that is the actual resistance $R_0$ reduced by the gain ($\alpha$).

FIG. 2 is a circuit diagram illustrating a first example of a conventional two-range auto-ranging source-measure unit (SMU) circuit 200. The SMU circuit 200 includes a voltage source V-DAC, a current source I-DAC, and an output 220 that is configured to be electrically coupled with a device under test (DUT).

The SMU circuit 200 also includes a power-providing circuit 250 that has a first amplifier 206 and a second amplifier 208 that is electrically coupled between the DUT and either the current source I-DAC or a buffer 210 dependent upon the present position of a first switch $S_1$. The power-providing circuit 250 also has first and second gain stage amplifiers 212, 214 that are electrically coupled between the DUT and either the voltage source V-DAC or the buffer 210 dependent upon the present position of a second switch $S_2$. A first resistor $R_0$ is electrically coupled with the DUT and the buffer 210. A second resistor $R_1$ is electrically coupled between the first resistor $R_0$ and the second resistor $R_1$.

In the example, the SMU circuit 200 sources voltage across the DUT when the two switches $S_1$ and $S_2$ are in the down positions as shown in the figure. The SMU circuit 200 has a control loop with an interaction between the DUT and the current sensing resistor that may be determined by the following:

$$\beta = Z_{DUT} + R_S / Z_{DUT}$$

where $R_S$ is either the first resistor $R_0$ or the second resistor $R_1$ depending on which range is active.

In situations where the impedance of the DUT ($Z_{DUT}$) is smaller than the active range resistance $R_S$, $\beta$ becomes significantly less than one and the control loop undesirably slows down.

FIG. 3 is a circuit diagram illustrating a second example of a conventional two-range auto-ranging source-measure unit (SMU) circuit 300. In the example, the SMU circuit 300 uses a single control loop and switch $S_1$ to transition between a voltage source V-DAC (i.e., when the switch $S_1$ is in the down position as shown in the figure) and a current source I-DAC (i.e., when the switch $S_1$ is in the up position).

In this second example, the resistors $R_0$ and $R_1$ are arranged in parallel. This is in contrast to the SMU circuit 200 of the first example, in which the resistors $R_0$ and $R_1$ are in series.

SUMMARY

Embodiments of the disclosed technology are generally directed to source measure unit (SMU) circuits and, more particularly, to the incorporating of active shunt circuit technology features into an SMU circuit. In certain embodiments, an active shunt SMU circuit includes an SMU or power supply having an active shunt circuit that is integrated with the current measuring sub-circuit of the SMU circuit. The active shunt circuit may be active during voltage sourcing of the SMU circuit and deactivated during current sourcing of the SMU circuit, while in a current limit, or both.

DETAILED DESCRIPTION

Embodiments of the disclosed technology are generally directed to source-measure unit (SMU) circuits. In certain embodiments, an active shunt SMU circuit includes an SMU or power supply having an active shunt circuit that is integrated with the current measuring sub-circuit of the SMU circuit. The active shunt circuit may be active during voltage sourcing of the SMU circuit and deactivated during current sourcing of the SMU circuit, while in a current limit, or both.

Active shunt circuitry is a relatively new technology that may be used to improve the voltage sourcing performance of an SMU circuit. Because, however, an active shunt circuit may degrade the performance of the SMU circuit when the SMU circuit switches from voltage sourcing to current sourcing, embodiments may include deactivating the active shunt circuit when the SMU circuit is sourcing current. In such embodiments, the benefits may still be achieved by the SMU circuit during voltage sourcing of the SMU circuit without the degradation performance that would otherwise occur during current sourcing of the SMU circuit.

The integration of an active shunt circuit into an SMU circuit advantageously enables the SMU circuit to settle faster when sourcing voltage. Such integration also enables the SMU circuit to remain stable while sourcing voltage into a larger capacitive load.

Figure 1:
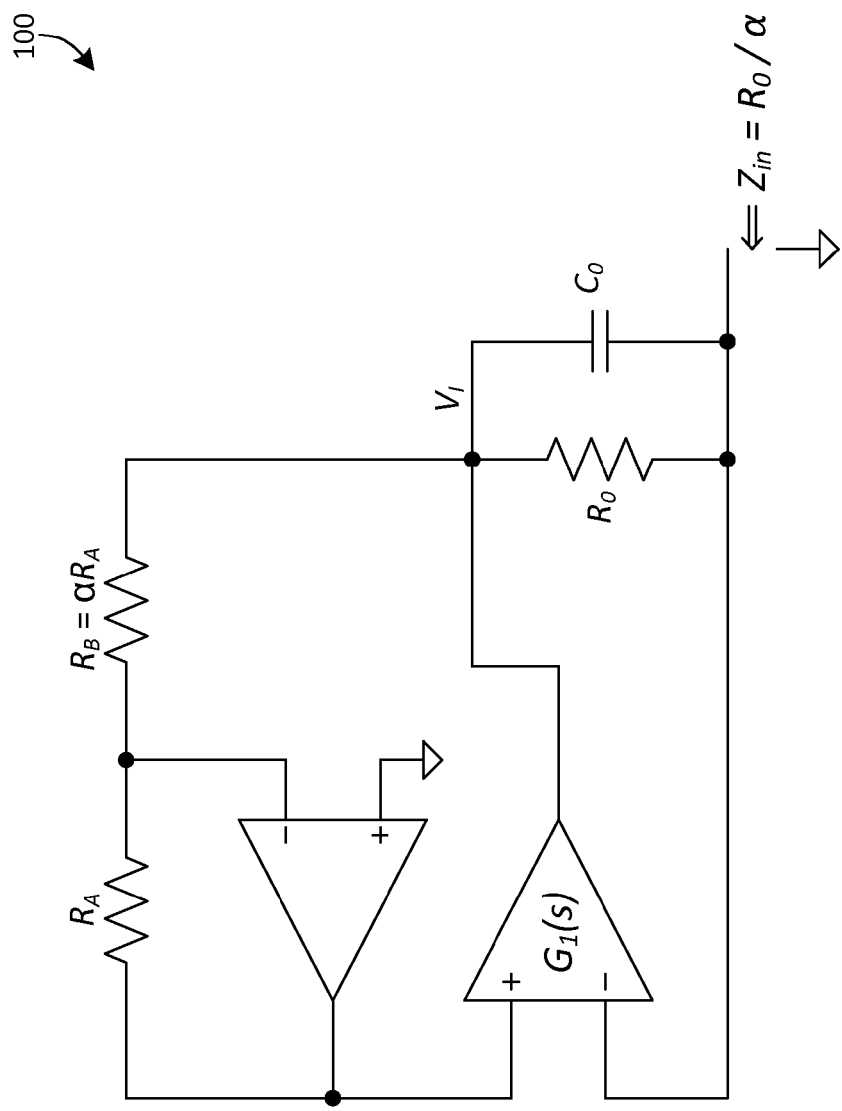
FIG. 1 is a circuit diagram illustrating an example of a conventional active shunt circuit.
Figure 2:
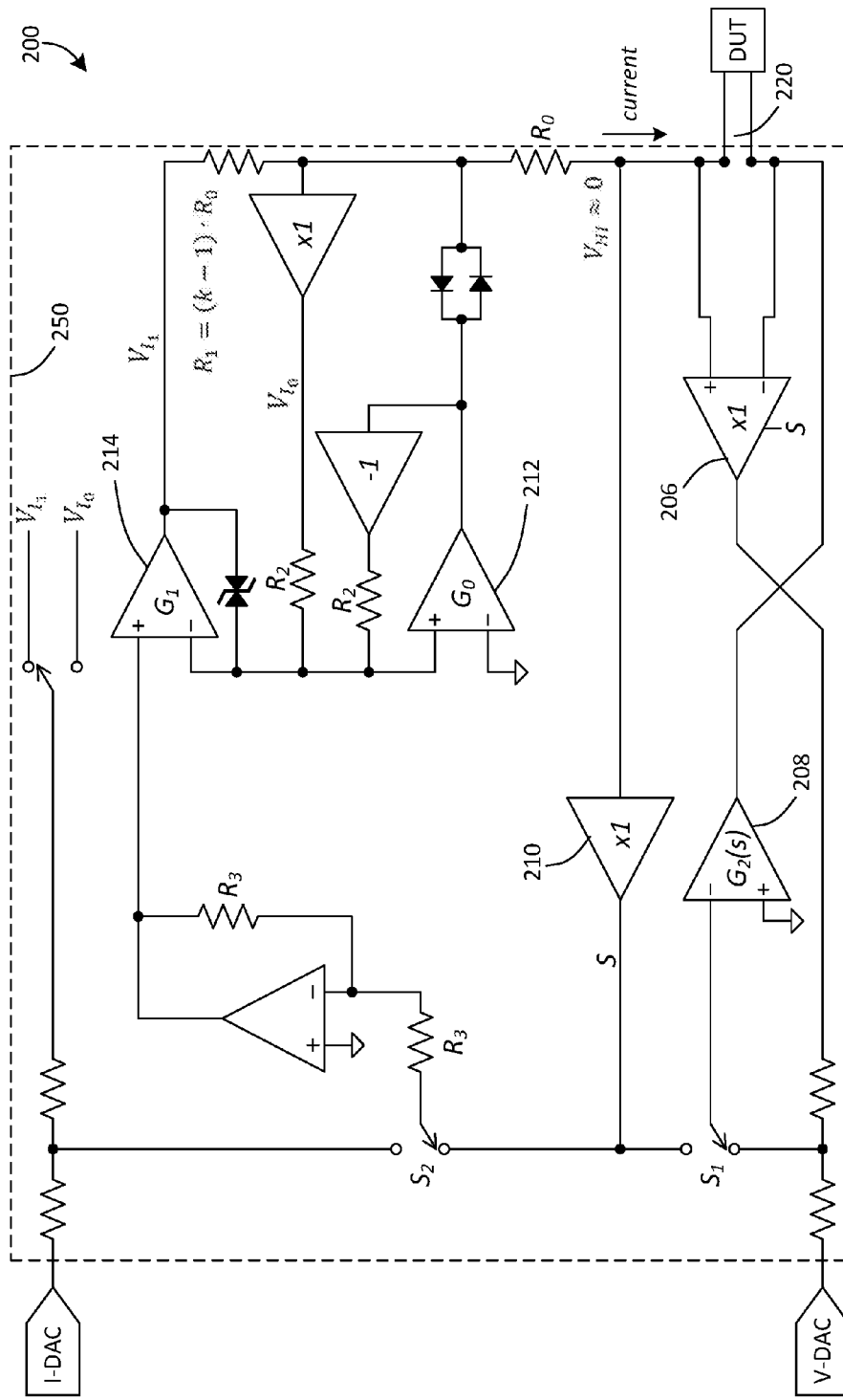
FIG. 2 is a circuit diagram illustrating a first example of a conventional two-range auto-ranging source-measure unit (SMU) circuit.
Figure 4:
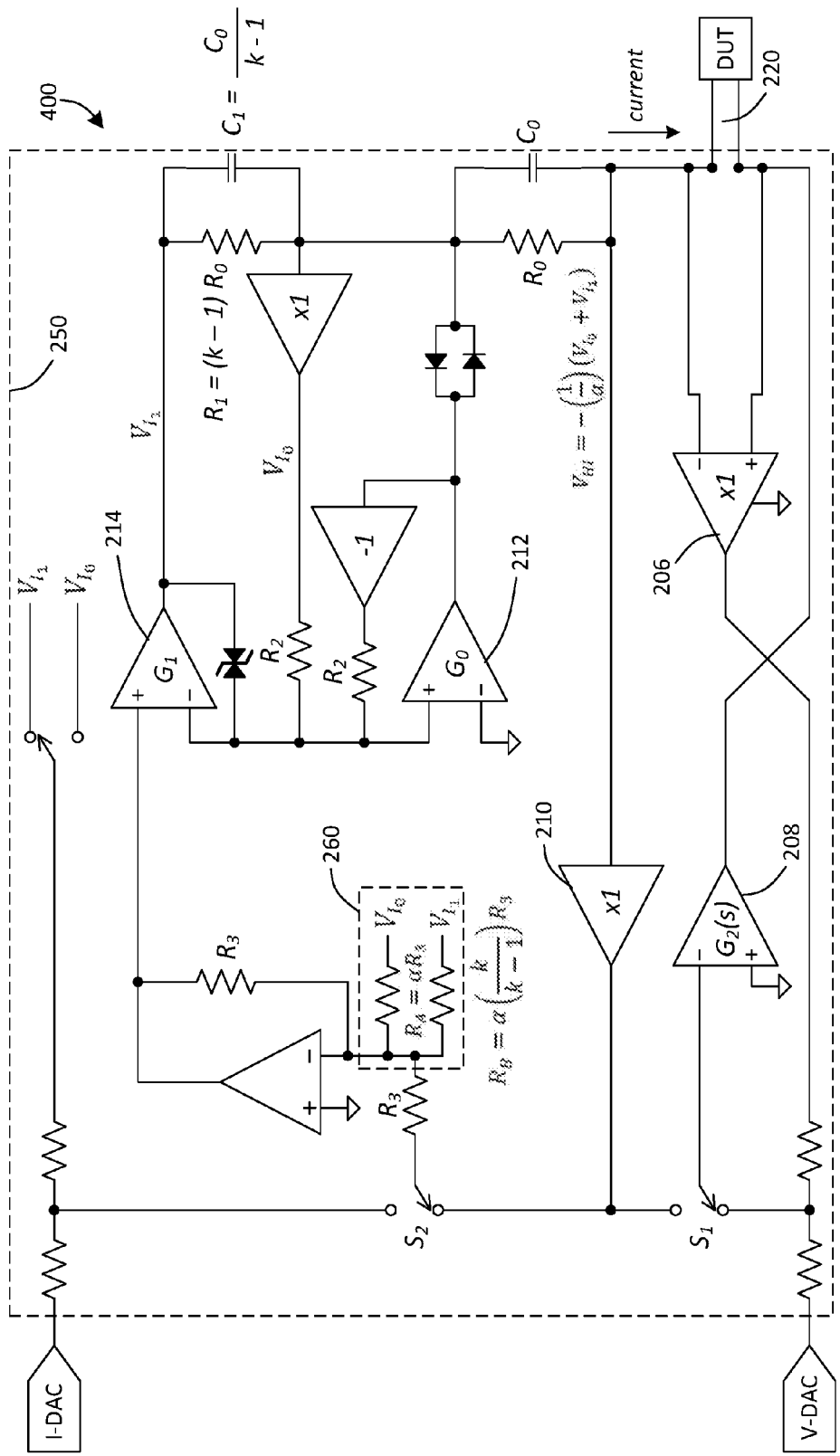
FIG. 4 is a circuit diagram illustrating a first example of a two-range auto-ranging source-measure unit (SMU) circuit having an active shunt integrated with the current measuring sub-circuit of the SMU circuit in accordance with certain embodiments of the disclosed technology.

FIG. 4 is a circuit diagram illustrating a first example of a two-range auto-ranging source-measure unit (SMU) circuit 400 having an active shunt integrated with the current measuring sub-circuit of the SMU circuit 400 in accordance with certain embodiments of the disclosed technology. In the example, the SMU circuit 400 is substantially identical to the SMU circuit 200 illustrated by FIG. 2 and, as such, the same reference identifiers used in connection with the description of FIG. 2 are also used in connection with the description of FIG. 4. Unlike the SMU circuit 200 illustrated by FIG. 2, however, an active shunt circuit 260 has been integrated into the SMU circuit 400 of FIG. 4 by way of two resistors $R_A$ and $R_B$ and two capacitors $C_0$ and $C_1$ and changing the reference of the differential amplifier 206 from signal S to ground.

The resistors $R_A$ and $R_B$ are added as feedback to the first and second gain stage amplifiers 212, 214 ($G_0$ and $G_1$), which limits the gain to $\alpha$. The capacitors $C_0$ and $C_1$ are added across the first and second resistors $R_0$ and $R_1$ such that their combined impedance rolls off at the same frequency at which the gain of $\alpha$ rolls off.

Whereas the interaction between the device under test (DUT) and the current sensing resistor in the SMU circuit 200 illustrated by FIG. 2 may be determined by $$\beta = \frac{Z_{DUT}}{Z_{DUT} + H_S},$$

integration of the active shunt to $R_S$ results in the following:

$$\beta = \frac{Z_{DUT}}{Z_{DUT} + \frac{R_S}{\alpha}}$$

where $\alpha$ represents the gain achieved by integration of the active shunt.

Consider an example in which $\alpha=100$. In such example, the impedance of the DUT ($Z_{DUT}$) must be at least one hundred times smaller in order for $\beta$ to be significantly less than one.

In the example illustrated by FIG. 4, the SMU circuit 400 sources current when both switches $S_1$ and $S_2$ are in the up position as shown in the figure, i.e., by applying a known voltage across either $R_0$ or $R_0+R_1$. The added resistors ($R_A$ and $R_B$) serve to limit the gain used to control the voltage that is applied to these resistors. While the resulting applied voltage is not precisely the inversion of the I-DAC voltage, because the gain $\alpha$ is determined by the ratio of resistors it can be precise and, thus, the I-DAC voltage can be predictably adjusted to correct the voltage in order to produce the desired current.

One having ordinary skill in the art will recognize that the same feedback structure may be used for one-range SMU circuits or multi-range SMU circuits.

Figure 3:
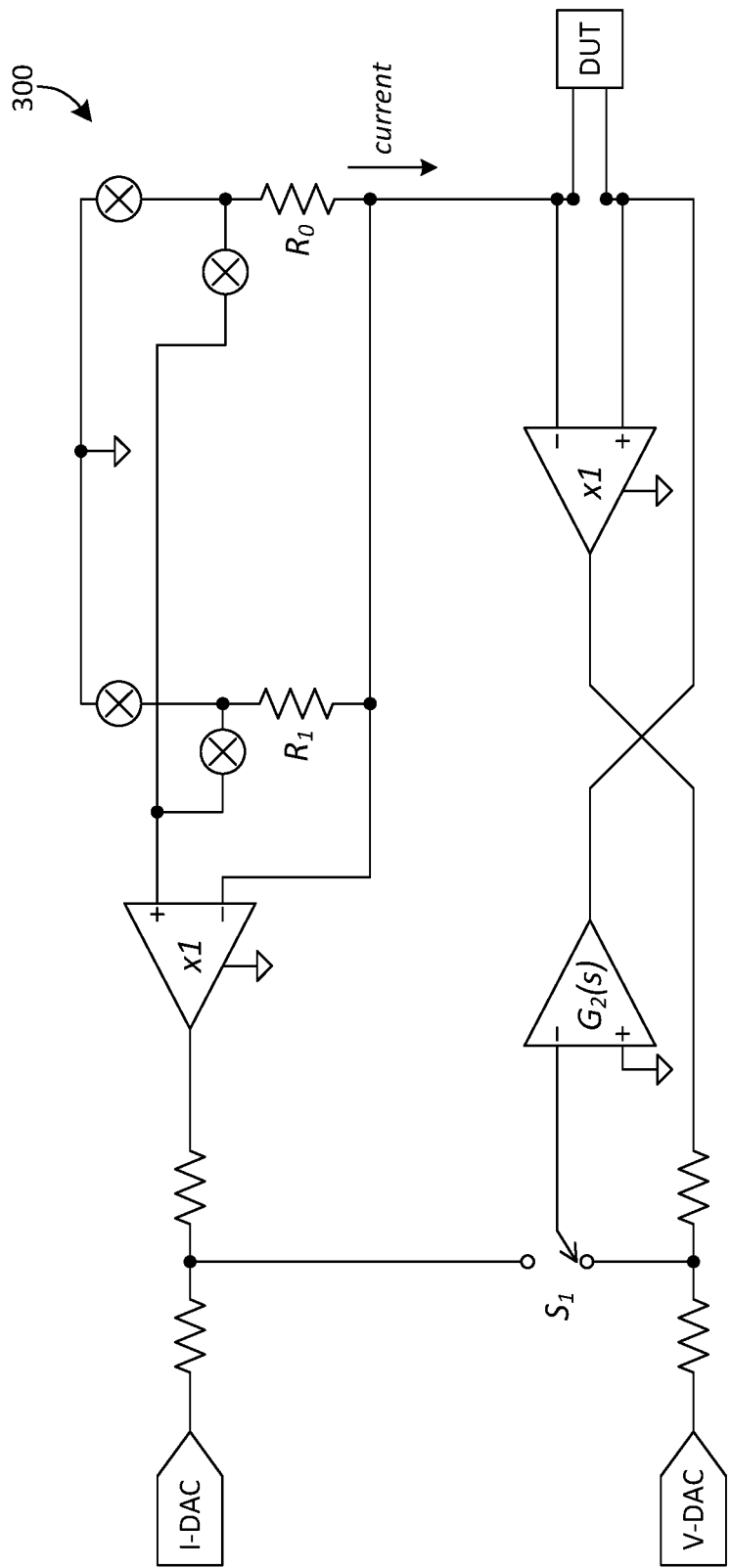
FIG. 3 is a circuit diagram illustrating a second example of a conventional two-range auto-ranging source-measure unit (SMU) circuit.
Figure 5:
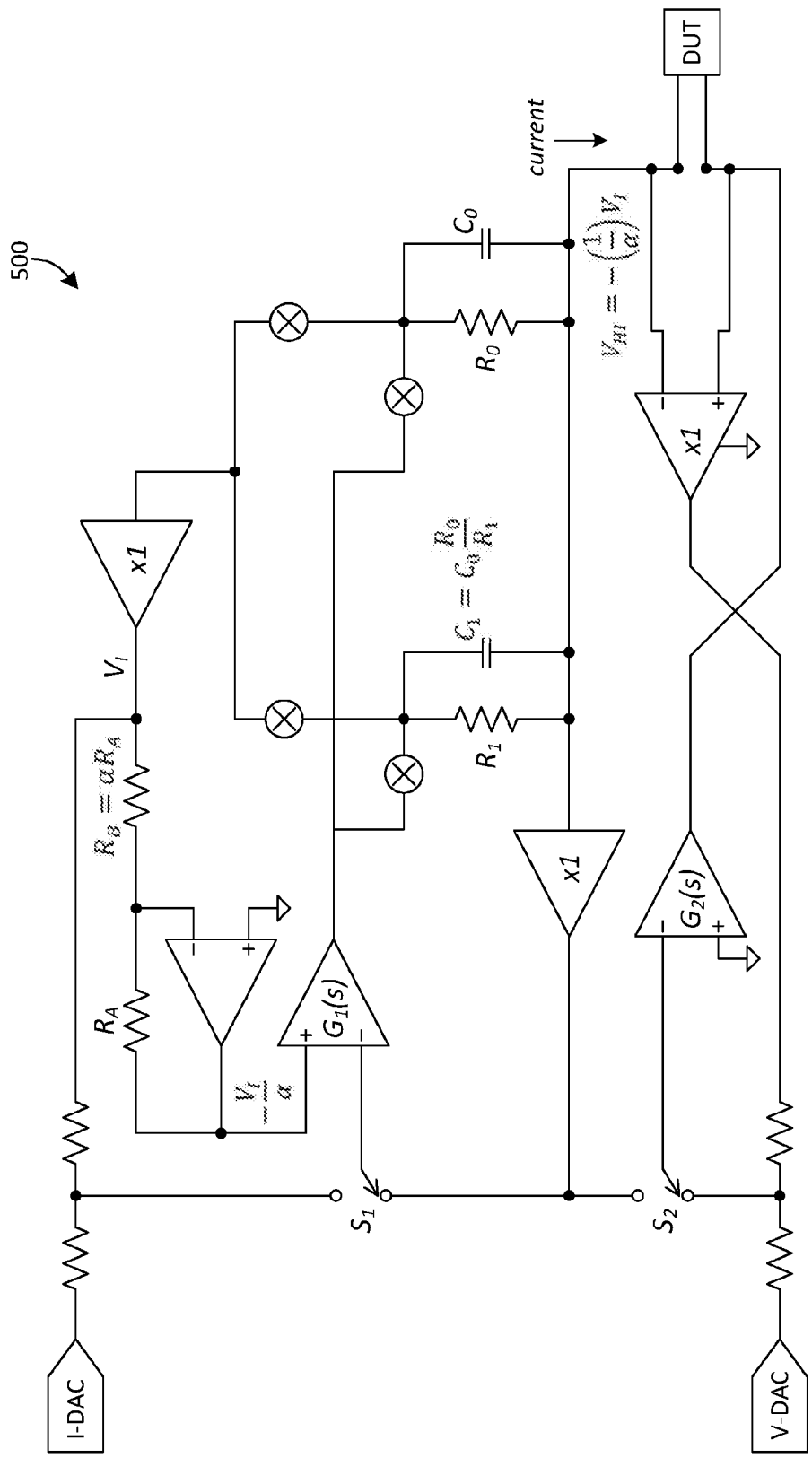
FIG. 5 is a circuit diagram illustrating a second example of a two-range auto-ranging source-measure unit (SMU) circuit having an active shunt integrated with the current measuring sub-circuit of the SMU circuit in accordance with certain embodiments of the disclosed technology.

FIG. 5 is a circuit diagram illustrating a second example of a two-range auto-ranging source-measure unit (SMU) circuit 500 having an active shunt integrated with the current measuring sub-circuit of the SMU circuit 500 in accordance with certain embodiments of the disclosed technology. In the example, the SMU circuit 500 is substantially identical to the SMU circuit 300 illustrated by FIG. 3 except for the addition of an active shunt circuit by way of two resistors $R_A$ and $R_B$, two capacitors $C_0$ and $C_1$, a limited gain stage, and a second switch $S_2$. The second switch $S_2$ may be used to effectively remove or deactivate the active shunt circuit during current sourcing by the SMU circuit 500.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

We claim:

1. A circuit for sourcing voltage and current to a device under test (DUT), the circuit comprising:
   an output configured to be electrically coupled with the DUT; and
   a power-providing circuit electrically coupled with the output, the power-providing circuit comprising:
   at least one sense resistor in series with the output, the at least one sense resistor including a first resistor $R_0$ having a first end electrically coupled with the output;
   a first capacitor $C_0$ electrically coupled in parallel with the first resistor $R_0$;
   a first amplifier electrically coupled with the output;
   a second amplifier electrically coupled between the output and a first switch;
   a first gain stage amplifier electrically coupled between the output and a second switch;
   a second gain stage amplifier electrically coupled between the output and the first gain stage amplifier;
   a second resistor $R_1$ electrically coupled between the third amplifier and the first resistor $R_0$; and
   a second capacitor $C_1$ electrically coupled in parallel with the second resistor $R_1$.

2. The circuit of claim 1, further comprising two resistors $R_A$ and $R_B$ added as feedback to the first and second gain stage amplifiers.

3. The circuit of claim 1, wherein the resistance of the second resistor $R_1$ is defined by the following:

$R_1=(k-1)R_0$

4. The circuit of claim 1, wherein the capacitance of the second capacitor $C_1$ is defined by the following:

$C_1=C_0/(k-1)$

5. The circuit of claim 1, wherein the first switch is configured to toggle a buffer that is electrically coupled with the output.

6. The circuit of claim 5, wherein the second switch is configured to toggle the buffer, and further wherein no more than one of the first and second switches is electrically coupled with the buffer at any given time.

7. The circuit of claim 5, wherein the second switch is configured to toggle a buffer that is electrically coupled with the output.

* * * * *